US012029060B2

(12) United States Patent
Wang et al.

(10) Patent No.: US 12,029,060 B2
(45) Date of Patent: Jul. 2, 2024

(54) DISPLAY DEVICE, DISPLAY PANEL AND FABRICATING METHOD THEREOF

(71) Applicant: BOE TECHNOLOGY GROUP CO., LTD., Beijing (CN)

(72) Inventors: Yu Wang, Beijing (CN); Kuanta Huang, Beijing (CN); Hui Tong, Beijing (CN); Xiaobin Shen, Beijing (CN); Xiong Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 765 days.

(21) Appl. No.: 17/258,473

(22) PCT Filed: Mar. 27, 2020

(86) PCT No.: PCT/CN2020/081884
§ 371 (c)(1),
(2) Date: Jan. 7, 2021

(87) PCT Pub. No.: WO2021/189498
PCT Pub. Date: Sep. 30, 2021

(65) Prior Publication Data
US 2022/0140275 A1    May 5, 2022

(51) Int. Cl.
*H10K 50/15* (2023.01)
*H10K 59/12* (2023.01)
(Continued)

(52) U.S. Cl.
CPC ............ *H10K 50/15* (2023.02); *H10K 59/12* (2023.02); *H10K 71/00* (2023.02); *H10K 50/813* (2023.02);
(Continued)

(58) Field of Classification Search
None
See application file for complete search history.

(56) References Cited

U.S. PATENT DOCUMENTS

2014/0027729 A1    1/2014    So et al.
2014/0159022 A1    6/2014    Song
(Continued)

FOREIGN PATENT DOCUMENTS

CN    109256472    1/2019
CN    110164906    8/2019
(Continued)

OTHER PUBLICATIONS

Search Report from European Application No. 20897673.8 dated Apr. 20, 2023.
(Continued)

*Primary Examiner* — Michael Lebentritt
(74) *Attorney, Agent, or Firm* — Calfee, Halter & Griswold LLP (57) ABSTRACT

A display panel includes: a driving substrate, a plurality of first electrodes, a hole transport layer, an organic light emitting layer, a second electrode layer and a color film layer. The hole transport layer includes a first portion and a second portion, the first portion is disposed between adjacent ones of the plurality of first electrodes and is located on a surface of the driving substrate; the second portion is disposed on a surface of each of the first electrodes away from the driving substrate; a minimum distance between an upper surface of the first portion away from the driving substrate and the driving substrate is smaller than an minimum distance between an upper surface of the second portion away from the driving substrate and the driving substrate.

18 Claims, 4 Drawing Sheets

(51) Int. Cl.
  *H10K 71/00*   (2023.01)
  *H10K 50/813*  (2023.01)
  *H10K 102/00*  (2023.01)
(52) U.S. Cl.
  CPC ... *H10K 59/1201* (2023.02); *H10K 2102/351* (2023.02)

(56) References Cited

U.S. PATENT DOCUMENTS

| | | | |
|---|---|---|---|
| 2016/0093678 A1* | 3/2016 | Seo | H10K 50/13 257/89 |
| 2018/0351127 A1 | 12/2018 | So et al. | |
| 2019/0393272 A1 | 12/2019 | Kajimoto | |
| 2020/0066815 A1 | 2/2020 | Choi | |
| 2021/0066433 A1* | 3/2021 | Cha | H10K 59/131 |
| 2021/0399262 A1* | 12/2021 | Woo | H10K 50/86 |
| 2022/0376001 A1* | 11/2022 | Wu | H10K 59/35 |

FOREIGN PATENT DOCUMENTS

| | | |
|---|---|---|
| CN | 110164921 | 8/2019 |
| EP | 2744008 A1 | 6/2014 |
| WO | 2018/212960 A1 | 11/2018 |
| WO | 2020/177265 | 9/2020 |

OTHER PUBLICATIONS

Written Opinion from PCT/CN2020/081884 dated Dec. 29, 2020.
Written Opinion from PCT/CN2020/082884 dated Dec. 29, 2020.

\* cited by examiner

DISPLAY DEVICE, DISPLAY PANEL AND FABRICATING METHOD THEREOF

CROSS REFERENCE

This application is based upon and claims priority to International Application No. PCT/CN2020/081884, filed on Mar. 27, 2020, the entire contents thereof are incorporated herein by reference.

TECHNICAL FIELD

The present disclosure relates to the field of display technology, and in particular to a display device, a display panel and a fabricating method thereof.

BACKGROUND

With the increasing progress of Virtual Reality (VR) technology/Augmented Reality (AR) technology and the rapid growth of the market, display panel suitable for the VR/AR field are also developing toward miniaturization, high pixel per inch (PPI), fast response, and high color gamut. With the advantages of miniaturization and high PPI, the silicon-based organic light-emitting diode (OLED) display panel is also becoming a new focus of attention in the VR/AR field.

At present, silicon-based OLED products require smaller anode pixels and narrower anode spacing to meet high resolution, and OLED devices require higher brightness and high efficiency to cope with the optical loss caused by the pixelation of the color film layer.

However, although the existing silicon-based OLED devices can meet the requirements of high efficiency and high voltage, they will have additional impacts during actual applications, such as high current, crosstalk, and electric leakage, etc.

SUMMARY

According to one aspect of the present disclosure, a display panel is provided, the display panel including:

A driving substrate, including a plurality of driving transistors;

A plurality of first electrodes, disposed on a surface of one side of the driving substrate and spaced with each other, and the plurality of first electrodes being electrically connected to one electrode of the plurality of driving transistors in a one-to-one correspondence;

A hole transport layer, including a first portion and a second portion, the first portion is disposed between adjacent ones of the plurality of first electrodes and is located on a surface of the driving substrate; the second portion is disposed on a surface of each of the first electrodes away from the driving substrate; a minimum distance between an upper surface of the first portion away from the driving substrate and the driving substrate is smaller than an minimum distance between an upper surface of the second portion away from the driving substrate and the driving substrate;

An organic light emitting layer, disposed on a side of the hole transport layer away from the driving substrate;

A second electrode layer, disposed on a side of the organic light emitting layer away from the hole transport layer;

A color film layer, disposed on a side of the second electrode layer away from the organic light emitting layer.

In an exemplary embodiment of the present disclosure, a minimum distance between the upper surface of the second portion and the driving substrate is greater than twice a minimum distance between the upper surface of the first portion and the driving substrate.

In an exemplary embodiment of the present disclosure, the minimum distance between the upper surface of the first portion and the driving substrate is 50 Å-500 Å, the minimum distance between the upper surface of the second portion and the driving substrate is 350 Å-1700 Å.

In an exemplary embodiment of the present disclosure, the hole transport layer is an integral structure.

In an exemplary embodiment of the present disclosure, a thickness of the hole transport layer in a direction away from the driving substrate is 50 Å-500 Å.

In an exemplary embodiment of the present disclosure, a gap between adjacent ones of the plurality of first electrodes is less than one third of a maximum width of an orthographic projection of one of the first electrodes on the driving substrate.

In an exemplary embodiment of the present disclosure, an aperture ratio is greater than 50%, and the gap between adjacent ones of the plurality of first electrodes is less than 4 μm.

In an exemplary embodiment of the present disclosure, a thickness of each of the first electrodes in a direction away from the driving substrate is 300 Å to 1200 Å.

In an exemplary embodiment of the present disclosure, a maximum width of an orthographic projection of each of the first electrodes on the driving substrate is less than 13 μm.

In an exemplary embodiment of the present disclosure, the display panel further includes:

an electron transport layer, which is disposed on a side of the organic light emitting layer away from the hole transport layer, and the second electrode layer is disposed on a side of the electron transport layer away from the organic light emitting layer.

In an exemplary embodiment of the present disclosure, the display panel further includes:

an electron injection layer, which is disposed on a side of the electron transport layer away from the light emitting layer, and the second electrode layer is disposed on a side of the electron injection layer away from the electron transport layer.

In an exemplary embodiment of the present disclosure, the display panel further includes:

a hole block layer, which is disposed on a side of the organic light emitting layer away from the hole transport layer, and the electron transport layer is located on a side of the hole block layer away from the organic light emitting layer.

In an exemplary embodiment of the present disclosure, the display panel further includes:

a light extraction layer, which is disposed on a side of the second electrode layer away from the organic light emitting layer, and the color film layer is disposed on a side of the light extraction layer away from the second electrode layer.

In an exemplary embodiment of the present disclosure, an orthographic projection of the hole transport layer on the driving substrate is located within an orthographic projection of the light extraction layer on the driving substrate.

In an exemplary embodiment of the present disclosure, the display panel further includes:

an encapsulating layer, which is disposed on a side of the light extraction layer away from the second electrode layer, and the color film layer is disposed on a side of the encapsulating layer away from the light extraction layer.

In an exemplary embodiment of the present disclosure, an orthographic projection of the hole transport layer on the driving substrate is located within an orthographic projection of the encapsulating layer on the driving substrate.

According to another aspect of the present disclosure, a fabricating method of the display panel is provided, the fabricating method including:

Providing a driving substrate, the driving substrate comprising a plurality of driving transistors;

Forming a plurality of first electrodes on one side of the driving substrate and spaced with each other, and the plurality of first electrodes are electrically connected to one electrode of the plurality of driving transistors in a one-to-one correspondence;

Forming a hole transport layer between adjacent ones of the plurality of first electrodes, the hole transport layer including a first portion and a second portion, the first portion is disposed between adjacent ones of the plurality of first electrodes and is located on a surface of the driving substrate; the second portion is disposed on a surface of each of the first electrodes away from the driving substrate; a minimum distance between an upper surface of the first portion away from the driving substrate and the driving substrate is smaller than an minimum distance between an upper surface of the second portion away from the driving substrate and the driving substrate;

Forming an organic light emitting layer on a side of the hole transport layer away from the driving substrate;

Forming a second electrode layer on a side of the organic light emitting layer away from the hole transport layer;

Forming a color film layer on a side of the second electrode layer away from the organic light emitting layer.

According to another aspect of the present disclosure, one display device is provided, the display device incudes the display panel described above.

BRIEF DESCRIPTION OF THE DRAWINGS

The accompanying drawings are used to provide a further understanding of the embodiments of the present disclosure, and constitute a part of the specification to be used to explain the present disclosure together with the embodiments of the present disclosure, and do not constitute a limitation of the embodiments of the present disclosure. The above and other features and advantages will become more apparent to those skilled in the art by describing detailed exemplary embodiments with reference to the accompanying drawings. In the accompanying drawings.

DETAILED DESCRIPTION

Exemplary embodiments will now be described more fully with reference to the accompanying drawings. However, the exemplary embodiments can be implemented in various ways, and should not be construed as being limited to the embodiments set forth herein. Instead, these embodiments are provided so that the present disclosure will be comprehensive and complete, and will fully convey the concept of exemplary embodiments to those skilled in the art. The same reference numeral in the accompanying drawings refers to the same or similar structure(s), and thus their detailed descriptions will be omitted.

Although relative terms such as "upper" and "lower" are used in this specification to describe the relative relationship of one component shown in the drawings to another, these terms are used in this specification only for convenience, for example, according to direction of the exemplary described in the drawings. It can be understood that if the device shown in the drawings is turned over and the device is turned upside down, the components described as "upper" will become "lower" components. When a structure is "on" another structure, it may mean that a certain structure is integrally formed on another structure, or that a certain structure is "directly" disposed on another structure, or that a certain structure is "indirectly" disposed on other structures through another structure.

The terms "one", "a/an", "this/the" and "said" are used to denote the existence of one or more elements/components/etc. The terms "include" and "have" are used to denote the meaning of open inclusion and refer to the existence of additional elements/components/etc. in addition to the listed elements/components/etc. The terms "first" and "second" are only used as markers and are not a restriction on the number of objects.

The applicant found that in the existing OLED devices, each organic layer uses an open mask during evaporation, so a hole injection layer will also exist between the two anodes. Since the hole injection layer is a highly conductive organic material and has a transport performance similar to that of metal, the hole injection layer between two anodes will conduct electricity between adjacent anodes. Therefore, when a hole injection layer is energized, the two adjacent anodes will also be turned on, which will cause the organic light emitting layer of adjacent pixels to also be lit, so that the light color is not a true single light color, which causes problems such as cross color, crosstalk, and leakage current.

Figure 1:
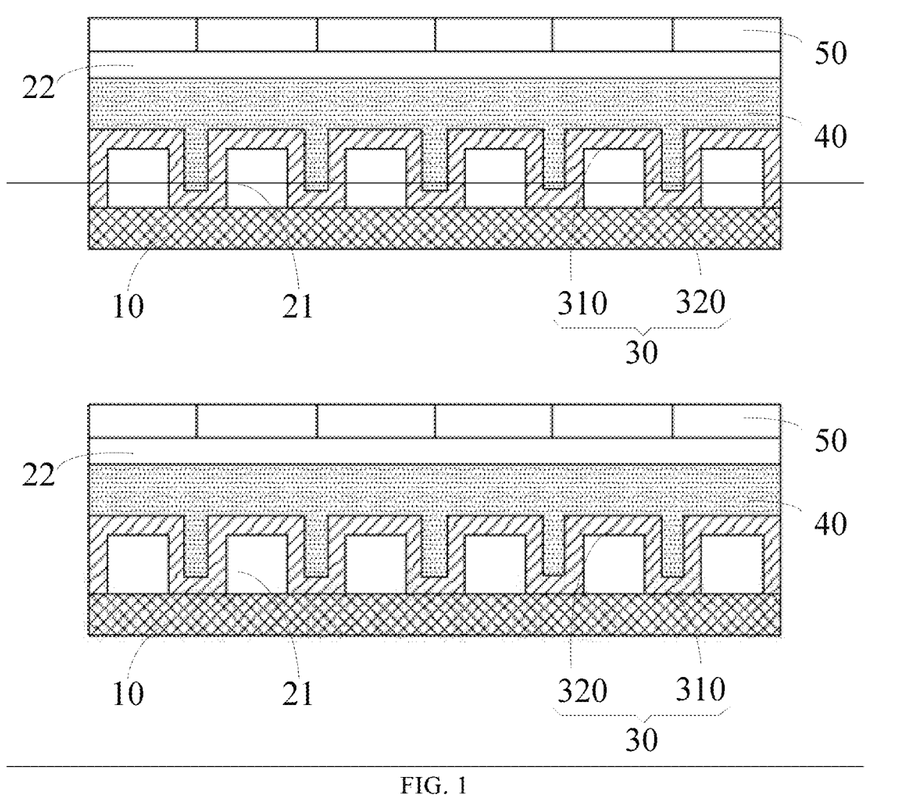
FIG. 1 is a schematic diagram of a display panel provided by an embodiment of the disclosure.

In this exemplary embodiment, a display panel is first provided, as shown in FIG. 1, the display panel includes: a driving substrate 10, a plurality of first electrodes 21, a hole transport layer 30, an organic light emitting layer 40, a second electrode layer 22, and a color film layer 50. The driving substrate 10 includes a plurality of driving transistors; the plurality of first electrodes 21 are disposed on a surface of one side of the driving substrate 10 and spaced with each other, and the plurality of first electrodes 21 are electrically connected to one electrode of the plurality of driving transistors in a one-to-one correspondence, and the one electrode of the driving transistors may be, for example, the source electrode. The hole transport layer 30 includes a first portion 310 and a second portion 320. The first portion 310 is disposed between adjacent ones of the plurality of first electrodes 21 and is located on the surface of the driving substrate 10. The second portion 320 is disposed on the surface of each first electrode 21 away from the driving substrate 10. The minimum distance between the upper surface of the first portion 310 away from the driving substrate 10 and the driving substrate 10 is smaller than the minimum distance between the upper surface of the second portion 320 away from the driving substrate 10 and the driving substrate 10. The organic light emitting layer 40 is disposed on the side of the hole transport layer 30 away from the driving substrate 10; the second electrode layer 22 is disposed on the side of the organic light emitting layer 40 away from the hole transport layer 30; the color film layer 50 is disposed on the side of the second electrode layer 22 away from the organic light emitting layer 40.

In the display panel provided by the present disclosure, the first portion 310 of the hole transport layer 30 is disposed on the surface of the driving substrate 10 between adjacent ones of the plurality of first electrodes 21, and the minimum distance between the upper surface of the first portion 310 and the driving substrate 10 is smaller than the minimum distance between the upper surface of the second portion 320 and the driving substrate 10, which increases the length of the first portion 310 between the second portions 320 on two adjacent first electrodes 21, and reduces the conductivity between adjacent second portions 320. In addition, the hole transport layer 30 on the opposite side surfaces of the two adjacent first electrodes 21 has uneven thickness, which reduces the conductivity of the hole transport layer 30 in this portion. Moreover, the hole transport layer 30 disposed between the adjacent ones of the plurality of first electrodes 21 has low conductivity, therefore, when one of the anodes is energized, the two adjacent anodes will not be conducted; thereby when a sub-pixel is lit, the adjacent sub-pixels will not be lit, so that a single sub-pixel can be individually controlled to emit light separately, so that the electric leakage between the sub-pixels is reduced, thereby improving the color purity of the spectrum, and further improving the color gamut of the product; after the electric leakage and crosstalk are reduced, the efficiency of the device can be improved and the life of the device can be improved.

Figure 5:
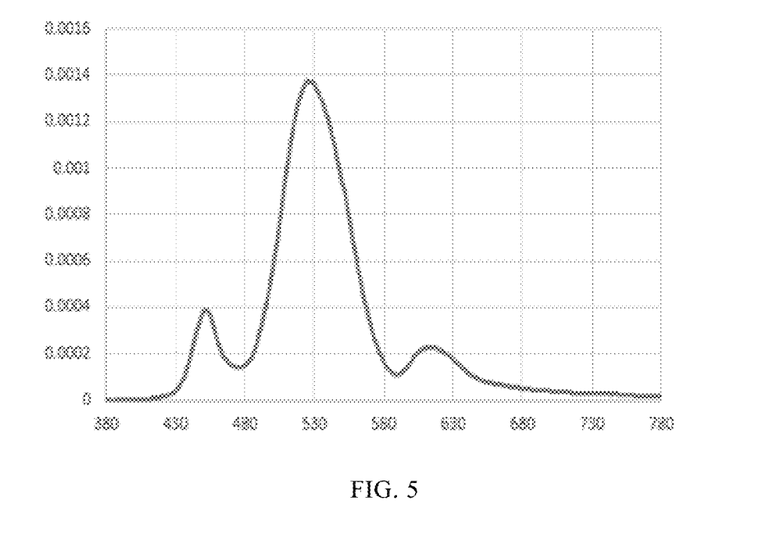
FIG. 5 is a monochromatic spectrum of a display panel in the related art.
Figure 6:
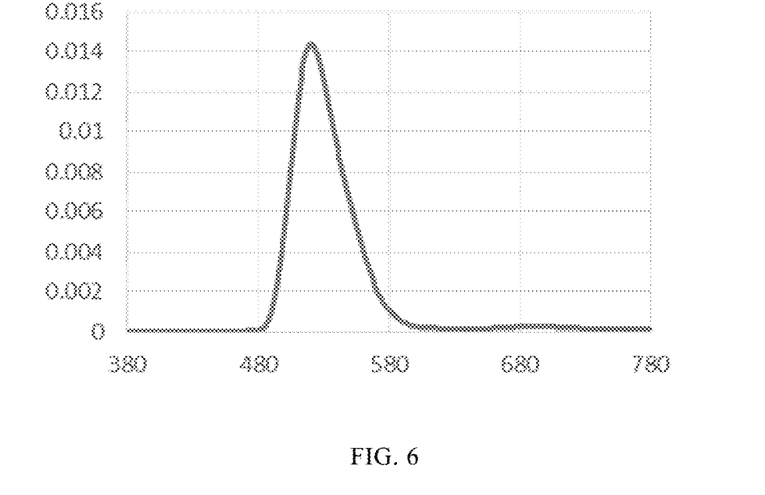
FIG. 6 is a monochromatic spectrum of a display panel provided by an embodiment of the disclosure.

FIGS. 5 and 6 show the spectra of products with different OLED device structures. The abscissa represents the light intensity and the ordinate represents the wavelength. Taking monochromatic G as an example, FIG. 5 shows the monochromatic G spectrum of an existing general product. It can be clearly seen that there are both R and B spectra when monochromatic G is lit. FIG. 6 shows the monochromatic G spectrum of the OLED device structure of the present disclosure. It can be seen that when a single G is lit, no R and B spectra appear, that is, the electric leakage between the sub-pixels of the OLED device structure of the present disclosure is reduced, thereby improving the color purity of the spectrum, which in turn can increase the color gamut of the product.

Specifically, the display panel provided by the present disclosure is a single unit white OLED device. The light emitting layer shares the hole transport layer and does not require a charge generation layer. Therefore, the driving voltage is smaller, usually less than 3.5V. The display panel is of a top emission type, in which the first electrode 21 is an anode, and the second electrode layer 22 is a cathode. Where, the anode may be formed of Ti material layer, Ag material layer, and ITO material layer stacked in sequence in a direction away from the driving substrate 10, of course, the anode may also be composed of other material layers, which is not limited in the present disclosure.

Exemplary, the minimum distance between the upper surface of the second portion 320 of the hole transport layer 30 and the driving substrate 10 is greater than twice the minimum distance between the upper surface of the first portion 310 and the driving substrate 10 to ensure that the length of the first portion 310 between the second portions 320 on two adjacent first electrodes 21 is relatively larger, thereby reducing the conductivity between adjacent second portion 320 and reducing the occurrence of electric leakage and crosstalk.

Exemplary, the minimum distance between the upper surface of the first portion 310 of the hole transport layer 30 and the driving substrate 10 is 50 Å-500 Å, for example, 50 Å, 100 Å, 200 Å, 300 Å, 400 Å, 500 Å, etc., which are not listed in detail herein. Of course, the minimum distance between the upper surface of the first portion 310 and the driving substrate 10 can also be less than 50 Å or greater than 500 Å; the minimum distance between the upper surface of the second portion 320 and the driving substrate 10 is 350 Å-1700 Å, for example, 350 Å, 400 Å, 600 Å, 1000 Å, 1500 Å, 1700 Å, etc., which are not listed in detail herein. Of course, the minimum distance between the upper surface of the second portion 320 and the driving substrate 10 can also be less than 350 Å or greater than 1700 Å, which is not limited in the present disclosure.

Figure 2:
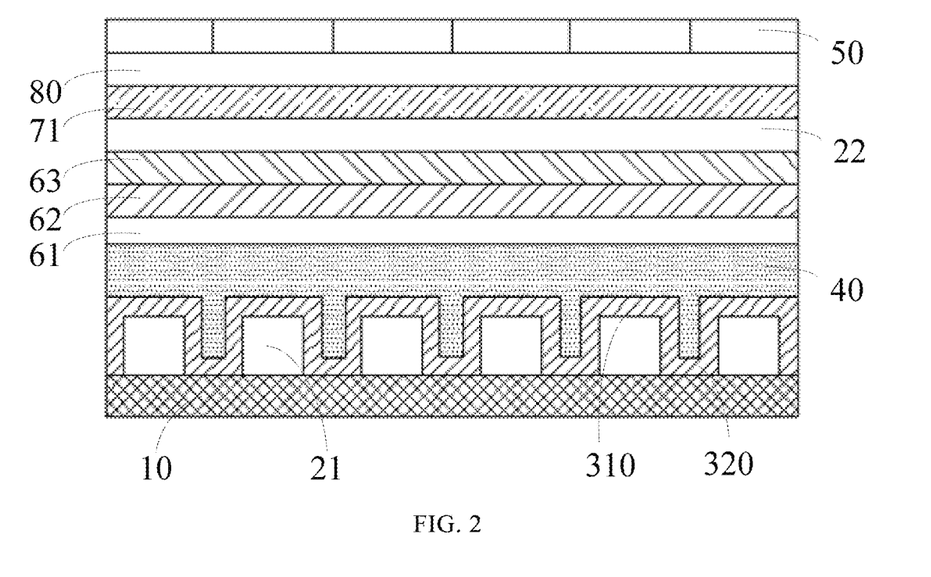
FIG. 2 is a schematic diagram of a display panel provided by another embodiment of the disclosure.

As shown in FIG. 2, the hole transport layer 30 is an integral structure. The hole transport layer 30 including the first portion 310 and the second portion 320 can be formed by a process such as evaporation, etc.

Where, the thickness of the hole transport layer 30 in the direction away from the driving substrate 10 is 50 Å-500 Å. For example, 50 Å, 100 Å, 200 Å, 300 Å, 400 Å, 500 Å, etc., which are not listed in detail herein. Of course, the thickness of the hole transport layer 30 may also be less than 50 Å or greater than 500 Å, and the present disclosure is not limited herein.

Exemplary, the thickness of each first electrode 21 in the direction away from the driving substrate 10 is 300 Å to 1200 Å. For example, 300 Å, 500 Å, 700 Å, 1000 Å, 1200 Å, etc., which are not listed in detail herein. Of course, the thickness of the first electrode 21 may also be less than 300 Å or greater than 1200 Å.

Exemplary, the maximum width of the orthographic projection of each first electrode 21 on the driving substrate 10 is less than 13 μm, for example, the orthographic projection of each first electrode 21 on the driving substrate 10 is a rectangle, and the width of each first electrode 21 is 3 μm-5 μm, for example, 3 μm, 4 μm, 5 μm, etc., which are not listed in detail herein. Of course, the width of the first electrode 21 may also be less than 3 μm or greater than 5 μm; the length of each first electrode 21 is 10 μm-13 μm. For example, 10 μm, 11 μm, 12 μm, 13 μm, etc., which are not listed in detail herein. Of course, the length of the first electrode 21 may also be less than 10 μm or greater than 13 μm. Of course, the orthographic projection of each first electrode 21 on the driving substrate 10 can also be in other shapes, such as a hexagon, a square, a circle, an ellipse, or an irregular shape, which is not limited in the present disclosure.

Where, the gap between adjacent ones of the plurality of first electrodes 21 is less than one third of the maximum width of the orthographic projection of the first electrodes 21 on the driving substrate 10. For example, the aperture ratio of the pixel is greater than 50%, and the gap between adjacent ones of the plurality of first electrodes 21 is less than 4 Specifically, in order to meet the requirements of the aperture ratio and to avoid the problem of unavoidable lateral electric leakage of adjacent pixels due to the smaller and smaller gaps as the resolution increases, when the resolution is greater than 2000 ppi and the aperture ratio is greater than 50%, the gap between the adjacent ones of the plurality of first electrodes 21 is less than 4 such as 1 µm, 2 µm, 3 µm, 4 µm, etc., which are not listed in detail here in this disclosure.

As shown in FIG. 2, the display panel further includes: an electron transport layer 62. The electron transport layer 62 is disposed on the side of the organic light emitting layer 40 away from the hole transport layer 30, and the second electrode layer 22 is disposed on the side of the electron transport layer 62 away from the organic light emitting layer 40.

As shown in FIG. 2, the display panel further includes: an electron injection layer 63. The electron injection layer 63 is disposed on the side of the electron transport layer 62 away from the light emitting layer, and the second electrode layer 22 is disposed on the side of the electron injection layer 63 away from the electron transport layer 62.

As shown in FIG. 2, the display panel further includes: a hole block layer 61. The hole block layer 61 is disposed on the side of the organic light emitting layer 40 away from the hole transport layer 30, and the electron transport layer 62 is located on the side of the hole block layer 61 away from the organic light emitting layer 40.

Figure 3:
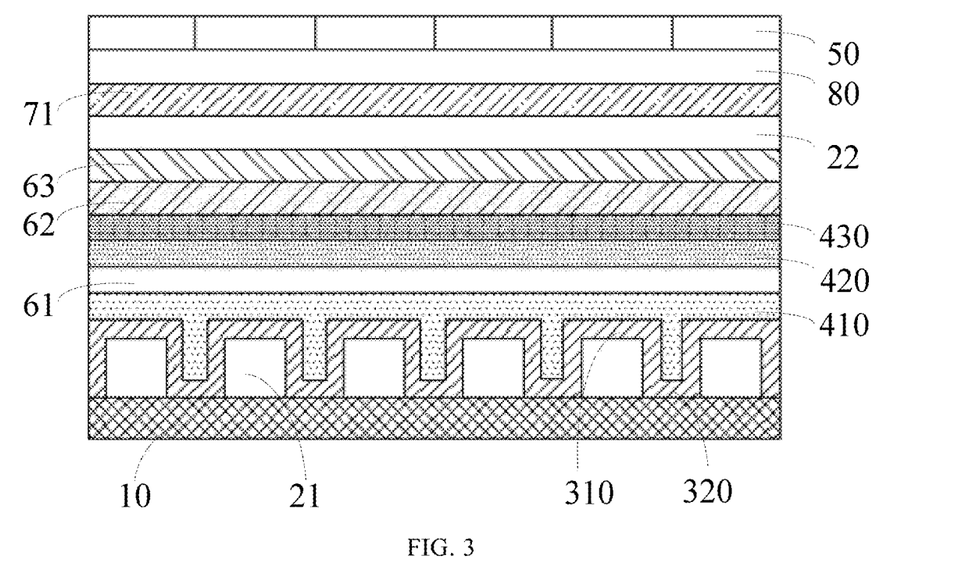
FIG. 3 is a schematic diagram of a display panel provided by another embodiment of the disclosure.

As shown in FIG. 3, the organic light emitting layer 40 includes a first light emitting layer 410, a second light emitting layer 420, and a third light emitting layer 430. The first light emitting layer 410, the second light emitting layer 420 and the third light emitting layer 430 are each one of R/G/B, the present disclosure does not limit the specific colors of the first light emitting layer 410, the second light emitting layer 420, and the third light emitting layer 430. For example, the first light emitting layer 410 is R color, the second light emitting layer 420 is G color, and the third light emitting layer 430 is B color to match to form a white light emitting layer. In addition, the thickness of the organic light emitting layer 40 is 900 Å-1000 Å, for example, 900 Å, 920 Å, 950 Å, 980 Å, 1000 Å, etc., which are not listed in detail herein. Of course, the thickness of the organic light emitting layer 40 can also be less than 900 Å or greater than 1000 Å, which is not limited in the present disclosure.

Figure 4:
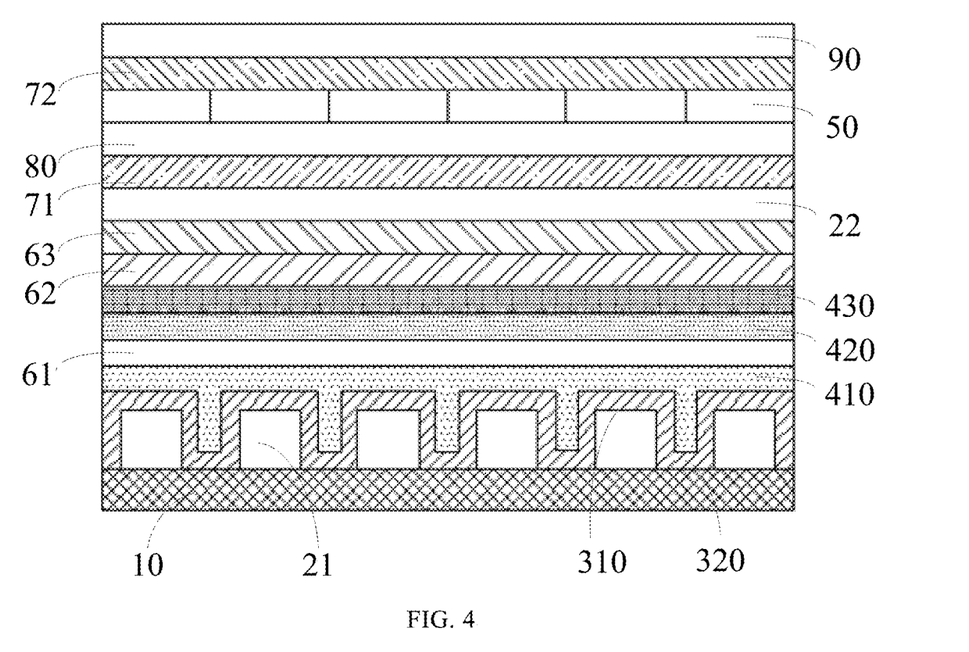
FIG. 4 is a schematic diagram of a display panel provided by another embodiment of the disclosure.

As shown in FIG. 4, the hole block layer 61 can also be disposed on the side of the first light emitting layer 410 away from the hole transport layer 30, and the second light emitting layer 420 is disposed on the side of the hole block layer 61 away from the first light emitting layer 410.

As shown in FIG. 2, the display panel further includes: a light extraction layer 80. The light extraction layer 80 is disposed on the side of the second electrode layer 22 away from the organic light emitting layer 40, and the color film layer 50 is disposed on the side of the light extraction layer 80 away from the second electrode layer 22.

Specifically, the orthographic projection of the hole transport layer 30 on the driving substrate 10 is located within the orthographic projection of the light extraction layer 80 on the driving substrate 10 to avoid the failure of the OLED light emitting function layer and improve the reliability of the display panel.

Specifically, the display panel further includes: an encapsulating layer disposed on the side of the light extraction layer 80 away from the second electrode layer, and the color film layer 50 is disposed on the side of the encapsulating layer away from the light extraction layer 80. As shown in FIG. 2, the encapsulating layer is a first encapsulating layer 71.

Where, the orthographic projection of the hole transport layer 30 on the driving substrate 10 is located within the orthographic projection of the encapsulating layer on the driving substrate 10 to avoid failure of the OLED light emitting function layer and improve the reliability of the display panel.

Further, as shown in FIG. 4, the display panel further includes: a second encapsulating layer 72, and the second encapsulating layer 72 is disposed on the side of the color film layer 50 away from the first encapsulating layer 71.

Further, as shown in FIG. 4, the display panel further includes: a cover glass 90, and the cover glass 90 is disposed on the side of the second encapsulating layer 72 away from the color film layer 50.

Figure 7:
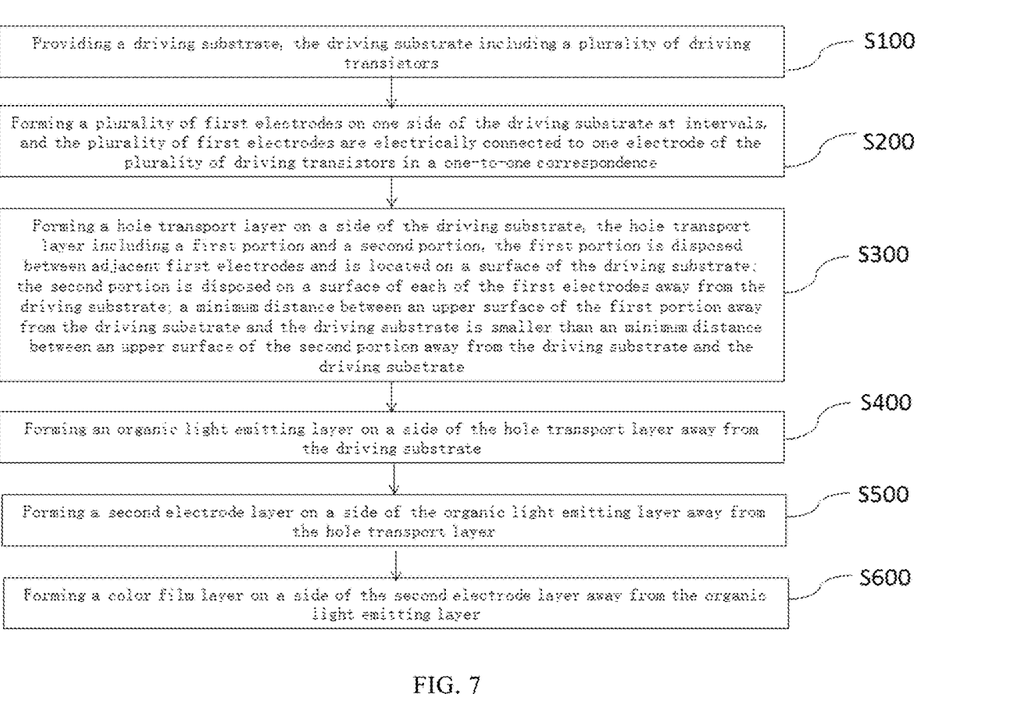
FIG. 7 is a schematic diagram of a fabricating method of a display panel provided by an embodiment of the disclosure.

The following are the method embodiments of the present disclosure, which can be used to fabricate the devices in the above embodiments of the disclosure. For details not disclosed in the method embodiments of the present disclosure, please refer to the device embodiments of the present disclosure The embodiment of the present disclosure also provides a fabricating method of a display panel. As shown in FIG. 7, the fabricating method includes:

Step S100, providing a driving substrate, which includes a plurality of driving transistors.

Step S200, forming a plurality of first electrodes on one side of the driving substrate and spaced with each other, and the plurality of first electrodes are electrically connected to one electrode of the plurality of driving transistors in a one-to-one correspondence.

Step S300, forming a hole transport layer on one side of the driving substrate, the hole transport layer includes a first portion and a second portion, the first portion is disposed between adjacent ones of the plurality of first electrodes and is located on the surface of the driving substrate; the second portion is disposed on the surface of each first electrode away from the driving substrate; the minimum distance between the upper surface of the first portion away from the driving substrate and the driving substrate is smaller than the minimum distance between the upper surface of the second portion away from the driving substrate and the driving substrate.

Step S400, forming an organic light emitting layer on the side of the hole transport layer away from the driving substrate.

Step S500, forming a second electrode layer on the side of the organic light emitting layer away from the hole transport layer.

Step S600, forming a color film layer on the side of the second electrode layer away from the organic light emitting layer.

In the display panel provided by the present disclosure, the first portion of the hole transport layer is disposed on the surface of the driving substrate between adjacent ones of the plurality of first electrodes, and the minimum distance between the upper surface of the first portion and the driving substrate is smaller than the minimum distance between the upper surface of the second portion and the driving substrate, which increases the length of the first portion between the second portions on two adjacent first electrodes, and reduces the conductivity between adjacent second portions. In addition, the hole transport layer on the opposite side surfaces of the two adjacent first electrodes has uneven thickness, which reduces the conductivity of the hole transport layer in this portion. Moreover, the hole transport layer disposed between the adjacent ones of the plurality of first electrodes has low conductivity, therefore, when one of the anodes is energized, the two adjacent anodes will not be conducted; thereby when a sub-pixel is lit, the adjacent sub-pixels will not be lit, so that a single sub-pixel can be individually controlled to emit light separately, so that the electric leakage between the sub-pixels is reduced, thereby improving the color purity of the spectrum, and further improving the color gamut of the product; after the electric leakage and crosstalk are reduced, the efficiency of the device can be improved and the life of the device can be improved.

Hereinafter, each step of the fabricating method of the display panel in this exemplary embodiment will be further described.

In step S100, providing a driving substrate, and the driving substrate includes a plurality of driving transistors.

Specifically, the driving substrate 10 includes driving transistors respectively formed on a silicon based substrate for connecting the first electrodes 21.

In step S200, forming a plurality of first electrodes on one side of the driving substrate and spaced with each other, and the plurality of first electrodes are electrically connected to one electrode of the plurality of driving transistors in a one-to-one correspondence.

Specifically, a plurality of first electrodes 21 arranged and spaced with each other can be formed on one side of the driving substrate 10 through processes such as deposition and etching, and the plurality of first electrodes 21 are electrically connected to one electrode of the plurality of driving transistors in a one-to-one correspondence. One electrode of the driving transistor can be, for example, a source electrode.

Where, the thickness of each first electrode 21 in the direction away from the driving substrate 10 is 300 Å to 1200 Å. For example, 300 Å, 500 Å, 700 Å, 1000 Å, 1200 Å, etc., which are not listed in detail herein. Of course, the thickness of the first electrode 21 may also be less than 300 Å or greater than 1200 Å. the maximum width of the orthographic projection of each first electrode 21 on the driving substrate 10 is less than 13 for example, the orthographic projection of each first electrode 21 on the driving substrate 10 is a rectangle, and the width of each first electrode 21 is 3 μm-5 μm, for example, 3 μm, 4 μm, 5 μm, etc., which are not listed in detail herein. Of course, the width of the first electrode 21 may also be less than 3 μm or greater than 5 μm; the length of each first electrode 21 is 10 μm-13 μm. For example, 10 μm, 11 μm, 12 μm, 13 μm, etc., which are not listed in detail herein. Of course, the length of the first electrode 21 may also be less than 10 μm or greater than 13 Of course, the orthographic projection of each first electrode 21 on the driving substrate 10 can also be in other shapes, such as a hexagon, a square, a circle, an ellipse, or an irregular shape, which is not limited in the present disclosure.

Where, the gap between adjacent ones of the plurality of first electrodes 21 is less than one third of the maximum width of the orthographic projection of the first electrodes 21 on the driving substrate 10. For example, the aperture ratio of the pixel is greater than 50%, and the gap between adjacent ones of the plurality of first electrodes 21 is less than 4 Specifically, in order to meet the requirements of the aperture ratio and to avoid the problem of unavoidable lateral electric leakage of adjacent pixels due to the smaller and smaller gaps as the resolution increases, when the resolution is greater than 2000 PPI and the aperture ratio is greater than 50%, the gap between the adjacent ones of the plurality of first electrodes 21 is less than 2 μm-4 μm, such as 1 μm, 2 μm, 3 μm, 4 μm, etc., which are not listed in detail here in this disclosure.

In step S300, forming a hole transport layer on one side of the driving substrate, the hole transport layer includes a first portion and a second portion. The first portion is disposed between adjacent ones of the plurality of first electrodes and is located on the surface of the driving substrate. The second portion is disposed on the surface of each first electrode away from the driving substrate. The minimum distance between the upper surface of the first portion away from the driving substrate and the driving substrate is smaller than the minimum distance between the upper surface of the second portion away from the driving substrate and the driving substrate.

Specifically, the hole transport layer 30 is formed on one side of the driving substrate 10 through a process such as evaporation, etc., and the hole transport layer 30 is an integral structure. Exemplary, the minimum distance between the upper surface of the second portion 320 of the hole transport layer 30 and the driving substrate 10 is greater than twice the minimum distance between the upper surface of the first portion 310 and the driving substrate 10 to ensure that the length of the first portion 310 between the second portions 320 on two adjacent first electrodes 21 is relatively large, thereby reducing the conductivity between adjacent second portion 320 and reducing the occurrence of electric leakage and crosstalk.

Exemplary, the minimum distance between the upper surface of the first portion 310 of the hole transport layer 30 and the driving substrate 10 is 50 Å-500 Å, for example, 50 Å, 100 Å, 200 Å, 300 Å, 400 Å, 500 Å, etc., which are not listed in detail herein. Of course, the minimum distance between the upper surface of the first portion 310 and the driving substrate 10 can also be less than 50 Å or greater than 500 Å; the minimum distance between the upper surface of the second portion 320 and the driving substrate 10 is 350 Å-1700 Å, for example, 350 Å, 400 Å, 600 Å, 1000 Å, 1500 Å, 1700 Å, etc., which are not listed in detail herein. Of course, the minimum distance between the upper surface of the second portion 320 and the driving substrate 10 can also be less than 350 Å or greater than 1700 Å, which is not limited in the present disclosure.

Exemplary, the thickness of the hole transport layer 30 in the direction away from the driving substrate 10 is 50 Å-500 Å. For example, 50 Å, 100 Å, 200 Å, 300 Å, 400 Å, 500 Å, etc., which are not listed in detail herein. Of course, the thickness of the hole transport layer 30 may also be less than 50 Å or greater than 500 Å, and the present disclosure is not limited herein.

In step S400, forming an organic light emitting layer on the side of the hole transport layer away from the driving substrate.

Specifically, the organic light emitting layer 40 is formed through a process such as evaporation, etc., the organic light emitting layer 40 includes a first light emitting layer 410, a second light emitting layer 420, and a third light emitting layer 430. The first light emitting layer 410, the second light emitting layer 420 and the third light emitting layer 430 are each one of R/G/B, the present disclosure does not limit the specific colors of the first light emitting layer 410, the second light emitting layer 420, and the third light emitting layer 430. For example, the first light emitting layer 410 is R color, the second light emitting layer 420 is G color, and the third light emitting layer 430 is B color to match to form a white light emitting layer.

In addition, the thickness of the organic light emitting layer 40 is 900 Å-1000 Å, for example, 900 Å, 920 Å, 950 Å, 980 Å, 1000 Å, etc., which are not listed in detail herein. Of course, the thickness of the organic light emitting layer 40 can also be less than 900 Å or greater than 1000 Å, which is not limited in the present disclosure.

In step S500, forming a second electrode layer on the side of the organic light emitting layer away from the hole transport layer.

Specifically, the second electrode layer 22 is formed on the side of the organic light emitting layer 40 away from the hole transport layer 30 through processes such as deposition, etc. The display panel provided by the present disclosure is a top emission type, in which the first electrode 21 is an anode, and the second electrode layer 22 is a cathode.

In step S600, forming a color film layer on the side of the second electrode layer away from the organic light emitting layer.

Specifically, the color film layer 50 is formed on the side of the second electrode layer 22 away from the organic light emitting layer 40 through processes such as deposition, etc. Where, the film layer order of the color film layer 50 in the extension direction of the main body is not limited, for example, it can be RGB/RBG or GBR/GRB, etc.

The embodiment of the present disclosure also provides a display device, which includes the display panel described above. The beneficial effects of the display device can be referred to the beneficial effects of the display panel described above, which will not be repeated here. The display device may be, for example, a head-mounted display device such as VR/AR.

In addition, although the various steps of the method in the present disclosure are described in a specific order in the drawings, however this does not require or imply that these steps must be performed in the specific order, or that all the steps shown must be performed to achieve the desired result. Additionally or alternatively, some steps may be omitted, multiple steps may be combined into one step for performing, and/or one step may be divided into multiple steps for performing, etc.

Those skilled in the art will easily think of other embodiments of the present disclosure after considering the specification and practicing the disclosure disclosed herein. This application is intended to cover any variations, uses, or adaptive changes of the present disclosure. These variations, uses, or adaptive changes follow the general principles of the present disclosure and include common knowledge or conventional technical means in the technical field not disclosed in the present disclosure. The description and the embodiments are only regarded as exemplary, and the true scope and spirit of the present disclosure are pointed out by the appended claims.

What is claimed is:

1. A display panel, comprising:
a driving substrate, comprising a plurality of driving transistors;
a plurality of first electrodes, disposed on a surface of one side of the driving substrate and spaced with each other, and electrically connected to one electrode of the plurality of driving transistors in a one-to-one correspondence;
a hole transport layer, comprising a first portion and a second portion, wherein the first portion is disposed between adjacent ones of the plurality of first electrodes and is located on a surface of the driving substrate; the second portion is disposed on a surface of each of the first electrodes away from the driving substrate; a minimum distance between an upper surface of the first portion away from the driving substrate and the driving substrate is smaller than an minimum distance between an upper surface of the second portion away from the driving substrate and the driving substrate;
an organic light emitting layer, disposed on a side of the hole transport layer away from the driving substrate;
a second electrode layer, disposed on a side of the organic light emitting layer away from the hole transport layer;
a color film layer, disposed on a side of the second electrode layer away from the organic light emitting layer,
wherein the hole transport layer has an uneven thickness on opposite side surfaces of the adjacent ones of the plurality of first electrodes.

2. The display panel according to claim 1, wherein a minimum distance between the upper surface of the second portion and the driving substrate is greater than twice a minimum distance between the upper surface of the first portion and the driving substrate.

3. The display panel according to claim 1, wherein the minimum distance between the upper surface of the first portion and the driving substrate is 50 Å-500 Å, the minimum distance between the upper surface of the second portion and the driving substrate is 350 Å-1700 Å.

4. The display panel according to claim 1, wherein the hole transport layer is an integral structure.

5. The display panel according to claim 1, wherein a thickness of the hole transport layer in a direction away from the driving substrate is 50 Å-500 Å.

6. The display panel according to claim 1, wherein a gap between adjacent ones of the plurality of first electrodes is less than one third of a maximum width of an orthographic projection of one of the first electrodes on the driving substrate.

7. The display panel according to claim 6, wherein an aperture ratio is greater than 50%, and the gap between adjacent ones of the plurality of first electrodes is less than 4 μm.

8. The display panel according to claim 1, wherein a thickness of each of the first electrodes in a direction away from the driving substrate is 300 Å to 1200 Å.

9. The display panel according to claim 1, wherein a maximum width of an orthographic projection of each of the first electrodes on the driving substrate is less than 13 μm.

10. The display panel according to claim 1, further comprising:
an electron transport layer, disposed on a side of the organic light emitting layer away from the hole transport layer, wherein the second electrode layer is disposed on a side of the electron transport layer away from the organic light emitting layer.

11. The display panel according to claim 10, further comprising:
an electron injection layer, disposed on a side of the electron transport layer away from the light emitting layer, wherein the second electrode layer is disposed on a side of the electron injection layer away from the electron transport layer.

12. The display panel according to claim 10, further comprising:
a hole block layer, disposed on a side of the organic light emitting layer away from the hole transport layer, wherein the electron transport layer is located on a side of the hole block layer away from the organic light emitting layer.

13. The display panel according to claim 1, further comprising:
a light extraction layer, disposed on a side of the second electrode layer away from the organic light emitting layer, wherein the color film layer is disposed on a side of the light extraction layer away from the second electrode layer.

14. The display panel according to claim 13, wherein an orthographic projection of the hole transport layer on the driving substrate is located within an orthographic projection of the light extraction layer on the driving substrate.

15. The display panel according to claim 13, further comprising:
an encapsulating layer, disposed on a side of the light extraction layer away from the second electrode layer, wherein the color film layer is disposed on a side of the encapsulating layer away from the light extraction layer.

16. The display panel according to claim 15, wherein an orthographic projection of the hole transport layer on the driving substrate is located within an orthographic projection of the encapsulating layer on the driving substrate.

17. A fabricating method of a display panel, comprising:
providing a driving substrate, the driving substrate comprising a plurality of driving transistors;
forming a plurality of first electrodes on one side of the driving substrate and spaced with each other, wherein the plurality of first electrodes are electrically connected to one electrode of the plurality of driving transistors in a one-to-one correspondence;
forming a hole transport layer on a side of the driving substrate, wherein the hole transport layer comprises a first portion and a second portion, the first portion is disposed between adjacent ones of the plurality of first electrodes and is located on a surface of the driving substrate; the second portion is disposed on a surface of each of the first electrodes away from the driving substrate; a minimum distance between an upper surface of the first portion away from the driving substrate and the driving substrate is smaller than an minimum distance between an upper surface of the second portion away from the driving substrate and the driving substrate;
forming an organic light emitting layer on a side of the hole transport layer away from the driving substrate;
forming a second electrode layer on a side of the organic light emitting layer away from the hole transport layer;
forming a color film layer on a side of the second electrode layer away from the organic light emitting layer,
wherein the hole transport layer has an uneven thickness on opposite side surfaces of the adjacent ones of the plurality of first electrodes.

18. A display device, comprising a display panel, the display panel comprising:
a driving substrate, comprising a plurality of driving transistors;
a plurality of first electrodes, disposed on a surface of one side of the driving substrate and spaced with each other, and electrically connected to one electrode of the plurality of driving transistors in a one-to-one correspondence;
a hole transport layer, comprising a first portion and a second portion, wherein the first portion is disposed between adjacent ones of the plurality of first electrodes and is located on a surface of the driving substrate; the second portion is disposed on a surface of each of the first electrodes away from the driving substrate; a minimum distance between an upper surface of the first portion away from the driving substrate and the driving substrate is smaller than an minimum distance between an upper surface of the second portion away from the driving substrate and the driving substrate;
an organic light emitting layer, disposed on a side of the hole transport layer away from the driving substrate;
a second electrode layer, disposed on a side of the organic light emitting layer away from the hole transport layer;
a color film layer, disposed on a side of the second electrode layer away from the organic light emitting layer,
wherein the hole transport layer has an uneven thickness on opposite side surfaces of the adjacent ones of the plurality of first electrodes.

* * * * *